United States Patent [19]
Berney

[11] Patent Number: 5,559,370
[45] Date of Patent: Sep. 24, 1996

[54] ELECTRONIC LABEL AND CARRIERS THEREFOR

[75] Inventor: Jean-Claude Berney, Les Charbonnières, Switzerland

[73] Assignee: Gay Freres Vente et Exportation S.A., Geneva, Switzerland

[21] Appl. No.: 319,992

[22] Filed: Oct. 7, 1994

[30] Foreign Application Priority Data

Oct. 8, 1993 [CH] Switzerland ............ 03032/93

[51] Int. Cl.⁶ .................................. H01L 23/043
[52] U.S. Cl. .............. 257/679; 235/492; 257/698; 257/700
[58] Field of Search ................ 235/441, 492; 257/679, 690, 693, 695, 698, 700

[56] References Cited

U.S. PATENT DOCUMENTS

| | | | |
|---|---|---|---|
| 4,621,190 | 11/1986 | Saito et al. | 235/492 |
| 4,660,172 | 4/1987 | Holzer | 365/2 |
| 4,945,217 | 7/1990 | Bolan | 235/472 |
| 4,982,069 | 1/1991 | Kayanakis | 235/441 |
| 5,337,588 | 8/1994 | Chhatwal | 70/278 |
| 5,350,945 | 9/1994 | Hayakawa | 257/679 |

FOREIGN PATENT DOCUMENTS

| | | |
|---|---|---|
| 0262036 | 3/1988 | European Pat. Off. . |
| 2546327 | 11/1984 | France . |
| 2655368 | 6/1991 | France . |
| 0228743 | 12/1984 | Japan . |
| 0204788 | 9/1986 | Japan ............ 235/492 |
| 2082804 | 3/1982 | United Kingdom . |
| 93/18485 | 9/1993 | WIPO . |
| 93/24902 | 12/1993 | WIPO . |

OTHER PUBLICATIONS

"Key With LCD Indicator", IBM Technical Disclosure Bulletin NB8909109, Sep. 1989, vol. 32, No. 4B, pp. 109–110.

Catalogue of Touch Memory, Dallas Semiconductor pp. 1–39, 71 & 72; Feb. 20, 1992.

*Primary Examiner*—Peter Toby Brown
*Attorney, Agent, or Firm*—Walter C. Farley

[57] ABSTRACT

The memory device according to the invention has a rigid metallic part (1) ensuring a mechanical and electrical connection with a reading system. It incorporates an integrated EEPROM circuit with reading/writing by a power supply located internally of a hollow contact connected to the first power supply terminal of the IC and serving as a protective case. Everything is installed on a support (3) fixed in a slot (2) of the metallic part (1), which is connected to the second power supply terminal of the IC. It is possible to install several IC's in the same metallic part, so as to produce a multifunction device.

13 Claims, 4 Drawing Sheets

ELECTRONIC LABEL AND CARRIERS THEREFOR

FIELD OF THE INVENTION

The present invention relates to an electronic memory device including an integrated memory circuit, the device being carried by an object.

BACKGROUND OF THE INVENTION

At present there are numerous small devices, generally without an internal power supply, which make use of electronic memories which can be read or read and written by an adequate reading system and which apply to applications requiring a particular security. Reference can e.g. be made to all chip cards, which are used as means for obtaining money (credit cards, bank cards, etc.)., prepayment cards (telephone, coffee machines, car parks, etc.), as well as electronic key systems of varying degrees of sophistication.

However, two important points are detrimental to the reliability of most of these devices and consequently limit their applications. Firstly they are installed on plastics supports, which can be easily deformed or destroyed, even with a relatively limited mechanical or thermal stressing. Secondly the access to the memory requires several electric contacts, which are a significant and endemic source of poor operation. Frequently the situation is that the device (card, key, etc.) can no longer be introduced into the reading device or can no longer be read by the latter.

Therefore the use of such devices is limited to applications where their possible destruction would not have particularly harmful consequences.

SUMMARY OF THE INVENTION

An object of the invention is to provide a solution for these different problems by means of an electronic memory device having a particularly reliable construction.

According to the invention, this is achieved by an electronic memory device having an electroconductive material part used both as a housing and as an output contact for an integrated memory circuit. A limitation to the absolute minimum of the number of contacts as well as the characteristics referred to hereinafter also contribute to the solution of the problem. Preferably, the device has at least one integrated memory circuit with reading or reading/writing superimposed on the power supply and a rigid electroconductive or metal part serving as a housing or slot and in which can be fixed a support on which are installed the integrated memory circuit and at least one output contact. Said interconnection interface or support preferably has metallized zones arranged so as to ensure, after assembly, links between the first supply terminal of the integrated circuit and the output contact on the one hand and between the second supply terminal of the integrated circuit and said metallic part on the other, the latter being arranged in such a way as to ensure a mechanical and electrical connection with the reading system.

Therefore this construction makes it possible to obtain a robust, miniaturized device, whose access causes no problems, in view of the fact that the device only has two output contacts. As a result of its very small dimensions, the device according to the invention can be incorporated into a large number of objects without being noticed or without causing any inconvenience as a result of its presence. The device can contain information relating to the object in which it is incorporated or to the person carrying the object. In the first case said information can give details on the source or ownership of the object. In the second case the information can give details concerning the identity or status of the person. The device is more particularly intended for incorporation into a watch, a watch strap, a piece of jewelry or other personal object.

BRIEF DESCRIPTION OF THE DRAWINGS

The invention is described in greater detail hereinafter with reference to the attached drawings, wherein.

DESCRIPTION OF THE PREFERRED EMBODIMENTS

Figure 1A:
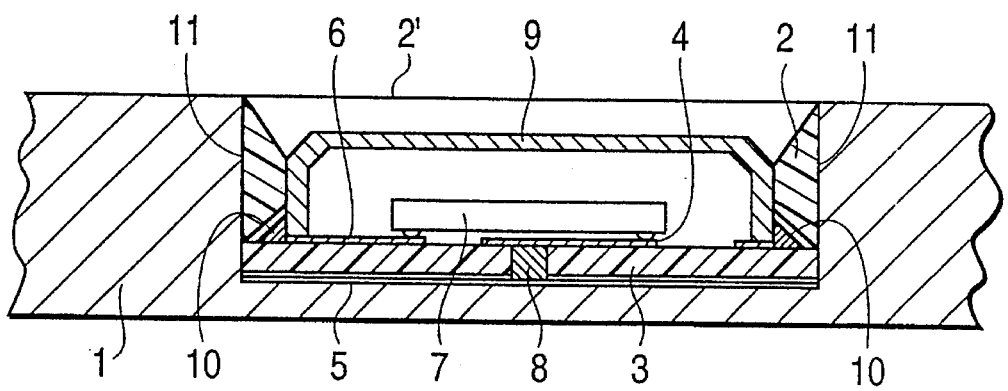
FIG. 1A is a side elevation, in section configuration of a memory device according to the invention showing the internal configuration thereof.
Figure 1B:
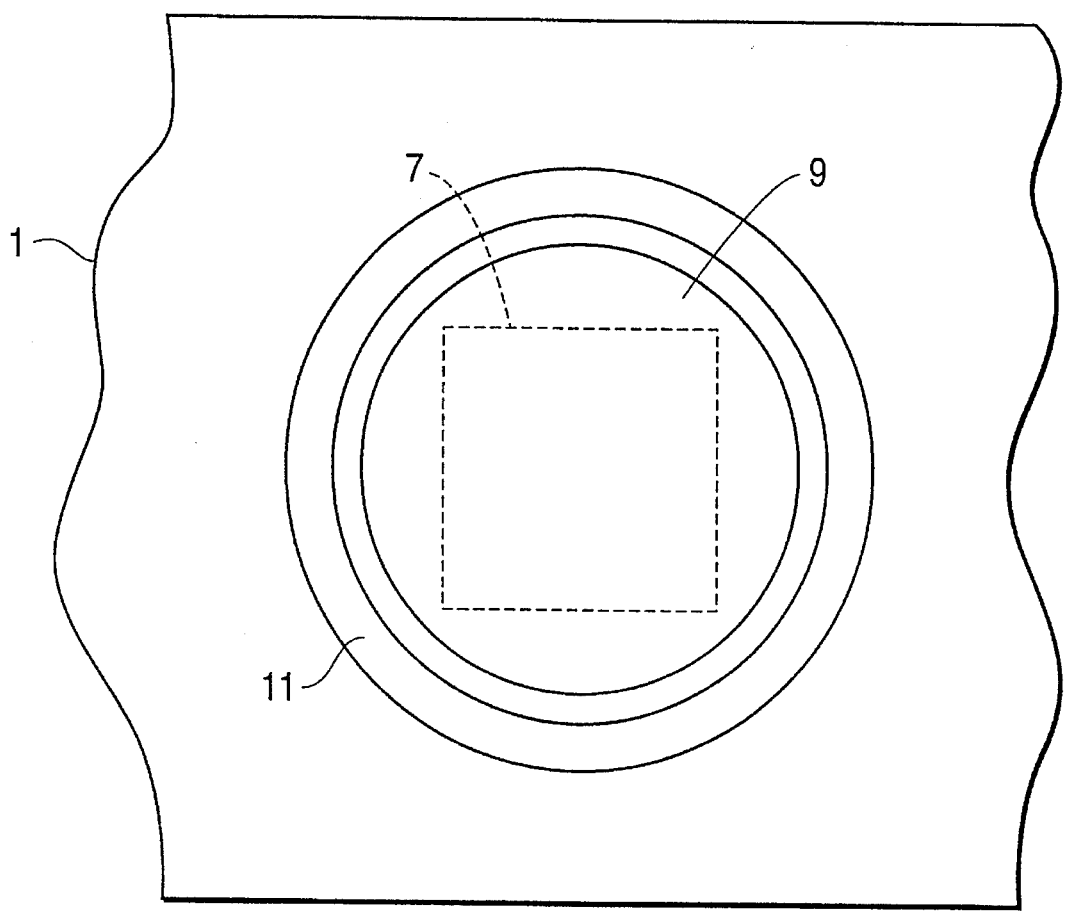
FIG. 1B is a top plan view of the device of FIG. 1A.

FIGS. 1A and 1B are respectively sectional and plan views of a part 1 made from an electrically conductive material, which is e.g. metallic and which has a cavity 2, in which is located a support 3. The support 3 can be a printed circuit having metallized zones 4, 5, 6 on two opposite faces and therefore serving as an interconnection interface. The integrated memory circuit 7 has terminals or bumps making it possible to ensure by thermo-compression the links between the integrated circuit and the metallized zones of the support. These links could also be brought about by bonding or any other known method. In the same way, the support could be produced on ceramic using a thin or thick film technology, or from plastics material using sealed-in contacts.

At present circuits of the EPROM type are known, which can be read or read and written to directly through the supply terminals. Although these circuits are not well known, we will not give details of their operation here, because it forms the subject matter of specific patent applications. It is sufficient to know that these circuits only require two electrical connections, a first supply pole connected to earth or ground, and a second supply pole.

In FIG. 1, the first supply pole of the integrated circuit 7 is connected by the metallized zone 4 to the metallized zone 5 on the lower face of the support by means of the metallized hole 8. This lower support face is in contact with the metallic part 1. This contact could be ensured during installation either by welding, or by a drop of conductive glue or adhesive. Thus, the metallic part is electrically connected to the first supply pole of the integrated circuit serving as the earth or ground.

The second supply pole of the integrated circuit is placed in the cavity 2 accessible through an opening 2' and is connected to the metallized zone 6 to which is fixed the metallic contact 9 by the weld 10. This contact 9, which has a hollow interior is placed over the integrated circuit and therefore serves as a protective cap for the latter. Finally, an e.g. synthetic material gasket 11 is forced between the contact 9 and the wall of the slot so as to ensure the overall sealing.

In this configuration, the reading system can access the two supply terminals of the integrated EEPROM circuit by establishing two contacts, one with the basic metallic part 1 and the other with the contact 9. Thus, the metallic part 1 has both an electrical function, by serving as an earth contact, and a mechanical function, by ensuring the rigidity of the assembly of the integrated circuit and its contact. However, as will be apparent from the following drawings, its mechanical function is not limited to this particular point.

It should be noted that this very compact configuration permits the use of the device according to the invention for producing highly miniaturized constructions.

Figure 2A:
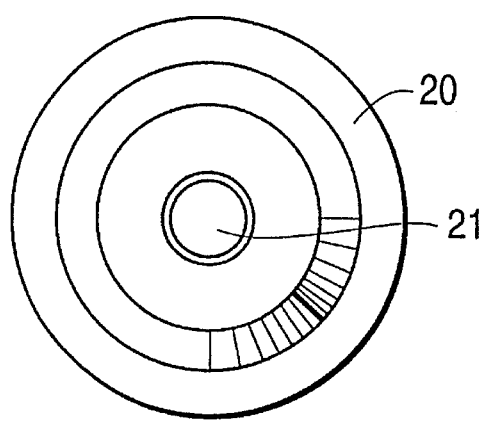
FIG. 2A is a top plan view of a device according to the invention, used as an electronic coin.
Figure 2B:
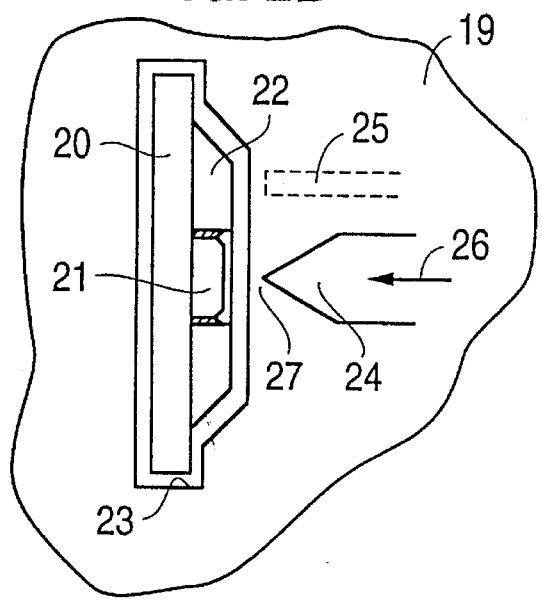
FIG. 2B is a side elevation, in section, of the device of FIG. 2A.

In FIGS. 2A and 2B, the device according to the invention is used as an electronic coin. For this purpose, the metallic part 20 is circular and its appearance and dimensions make it look like a coin and it has in its center a contact 21 giving access to the integrated EEPROM circuit containing the useful information for said application. However, the metallic part does not have a constant thickness and is instead provided with a reinforcement in its center 22. This particular shape of the mechanical part offers a number of advantages.

It firstly fulfils a foolproofing function. Thus, access to a reading system, a wall of which is indicated schematically at 19, is achieved by inserting the device of FIG. 2A through a slit 23 corresponding to the shape of the metallic part of the device according to the invention. Thus, it is not possible to introduce a larger coin. In the same way, it is possible to discharge excessively small coins, such as takes place in coin sorting systems. Finally, it is not possible to introduce the coin the wrong way up.

It also fulfils a centering function. Thus, if the slot of the reading system is sufficiently adapted to the shape of the coin, the contact 22 is automatically centered with respect to a tip 27 of the contact corresponding to a reading device 24. It should be noted that having a single contact 27 makes positioning much easier, because the angular position of the coin in the slot of the reading system is of no significance. It also permits access to the metallic part 20 on the same side by a second contact 25 also forming part of the reading device 24 and able to approach the coin by a movement in the direction indicated by the arrow 26. In all cases, the slit is provided with openings permitting access to the contacts 24, 25 belonging to the device 24.

Figure 3:
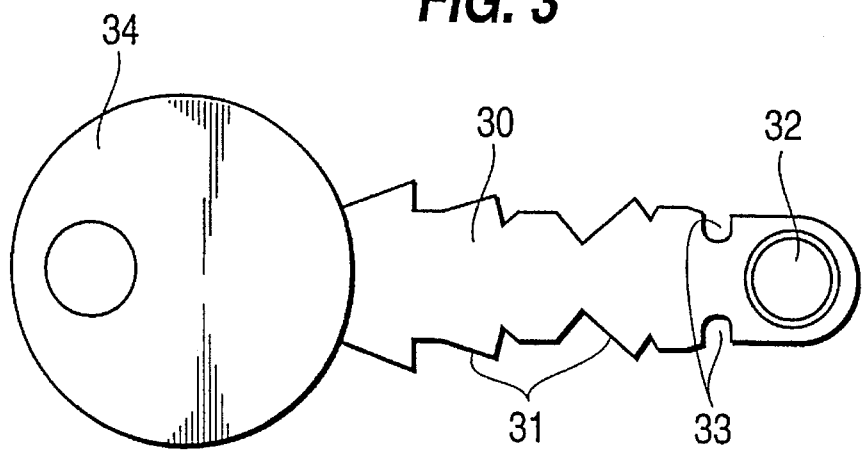
FIG. 3 is a schematic plan view of a device according to the invention used as an electronic key.

In FIG. 3, the device according to the invention is used as an electronic key. The metallic part 30 has the shape and dimensions of a normal key and has on its two edges a recess 31, which allows the key to operate a conventional lock. In this case, as well as in the case described relative to FIGS. 2A and 2B, the metallic and therefore electrically conductive part 20, 30 makes it possible to act on a mechanical system. The integrated circuit with its contact 32 is placed at the end of the key. Thus, it is possible to combine the conventional mechanical key function with the electronic key function.

Access to the reading system could only take place if it was possible to actuate the mechanical function beforehand. As the shape of the metallic part is more complex than in FIGS. 2A and 2B, it has two notches 33 permitting the positioning of the contact 32 with high precision with respect to the contact of the reading device. Thus, the metallic part can have elements more particularly used for positioning the contact. These elements can be located on the outside or inside of the metallic part, such as e.g. in the form of positioning holes.

It should also be noted that there is no need for the entire key to be metallic or electrically conductive and the metallic part can be limited to the useful zone where the integrated circuit is fitted and where it is necessary to have precise reference points for the reading system. Thus, the head of the key 34 can be made from a synthetic material.

Figure 4A:
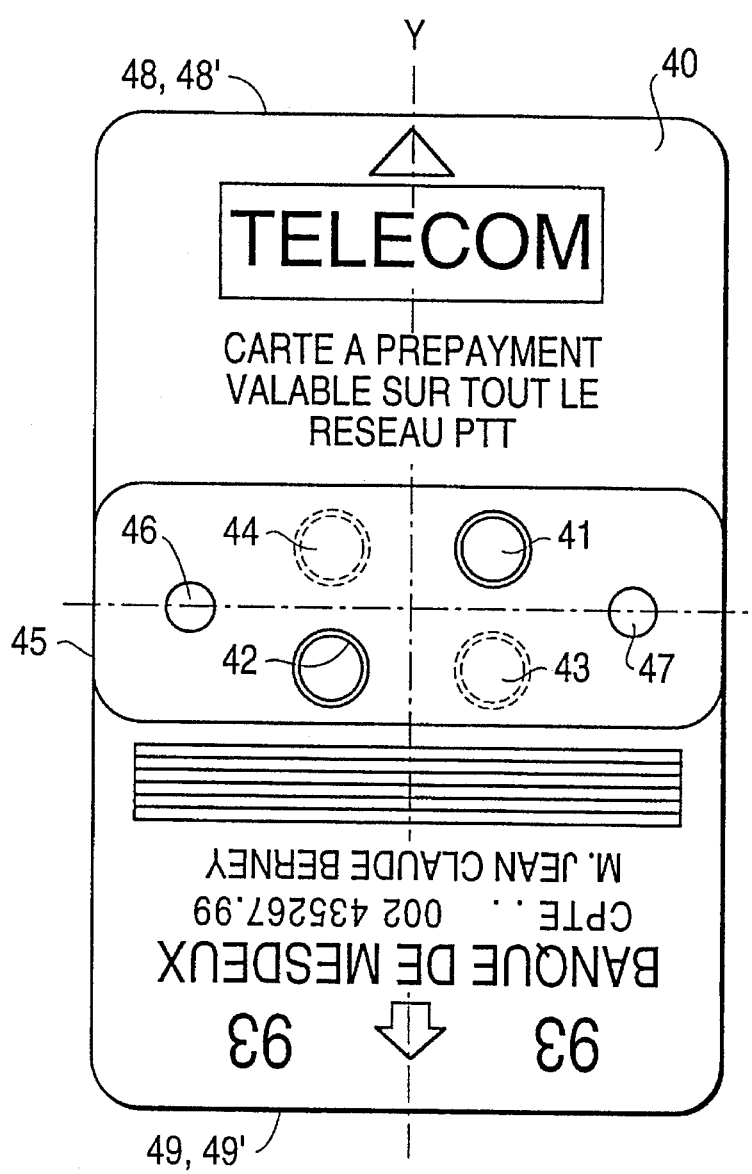
FIG. 4A is a front elevation of a multi-use credit card incorporating a device according to the invention.
Figure 4B:
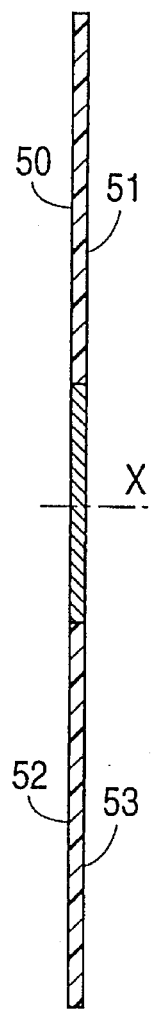
FIG. 4B is a side elevation of the credit card of FIG. 4A.

In the embodiment of FIGS. 4A and 4B, the device according to the invention is used in a prepayment or credit card. Such cards are becoming ever more widespread and therefore increasingly important. However, it is known that these cards have precise standardized dimensions preventing any large scale miniaturization. As a result of the very small dimensions of the device according to the invention, it is possible to find another solution by producing multichip cards, which would make it possible to have the equivalent of several normal cards on the same support. Thus, FIGS. 4A and 4B show a card 40 having standardized dimensions (scale approximately 2). Thus, such a card has two axes of symmetry X and Y and can be introduced in four different ways into a reading system (two 180° rotations on axis X and two 180° rotations on axis Y). Thus, it is possible to have four integrated circuits with their contacts 41, 42, 43, 44 on their supports in four separate cavities of the metallic part 45. These four cavities are symmetrically located relative to the X and Y axes. i.e. two above and two below. The metallic part also has two holes 46 and 47 making it possible to index the card in the reading system. The metallic part 45 serves as an earth contact for all the devices combined therein. Thus, the card has a device permitting four independent functions and can be used like four separate conventional cards.

It should be noted that the useful portion of the metallic part 45 carrying the integrated circuits is grouped in the center of the card in its most protected zone. The major surfaces of end portions (48, 49 and 48', 49' located on the back) can be used for carrying details concerning each use corresponding to the card. These details can be fixed or placed on separate labels (50, 51, 52, 53), e.g. self-adhesive, metallic labels, which can, if necessary, be changed.

Figure 5:
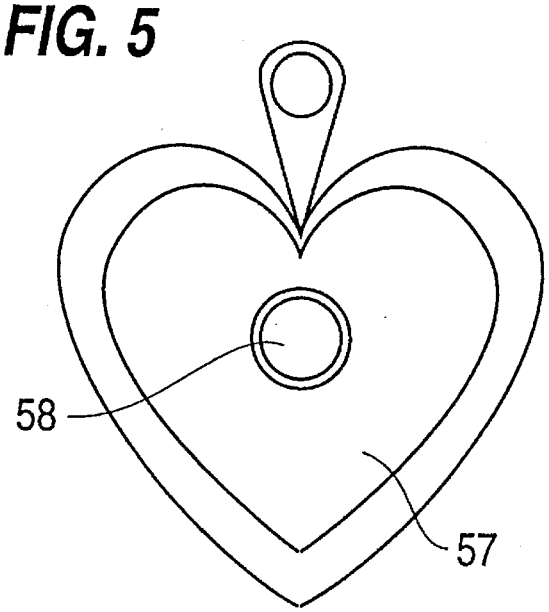
FIG. 5 is a rear view of a piece of jewelry with a device according to the invention incorporated therein and used for storing information such as medical information.
Figure 6:
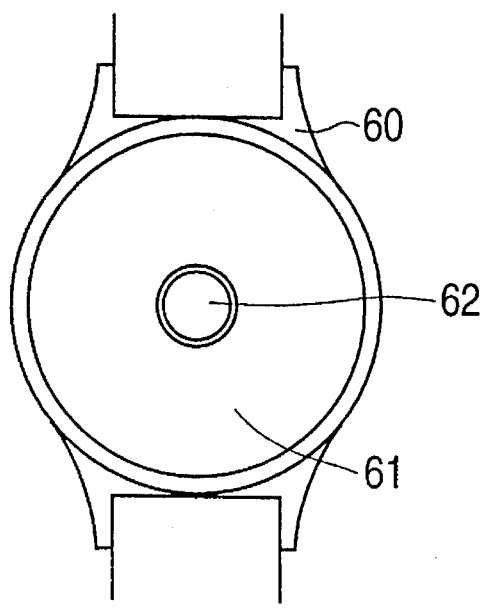
FIG. 6 is a rear view of a watch case showing a device according to the invention incorporated therein.
Figure 7:
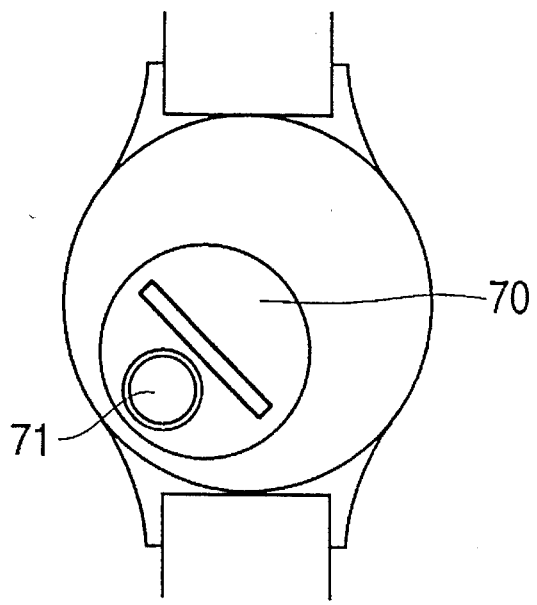
FIG. 7 is a rear view of a watch case showing a device according to the invention incorporated into a watch battery cover.

FIGS. 5, 6 and 7 relate to other applications of the device according to the invention for storing e.g. medical details. Numerous systems exist for storing medical details and information about a particular person such as the blood group, allergies, treatments, etc. and which can be rapidly read if the person is to be treated, e.g. as a result of an accident. However, such systems are not very reliable. Moreover, in order that the system is effective, it is necessary for the person to permanently carry said details which is a by no means negligible constraint, particularly in the case of children and older people. Due to the extreme miniaturization provided by the device according to the invention, it is possible to incorporate same into small objects which can be easily carried by the person in question, so as to solve this problem in a simple manner.

FIG. 5 diagrammatically shows a piece of jewelry, e.g. a pendant or bracelet, which has a metallic part 57, which may or may not be made from gold or some other precious metal and on said metallic or electrically conductive part is installed the support with its integrated memory circuit and contact 58. The face shown is the invisible face of the piece of jewelry, which is normally placed against the skin. It is therefore easy to incorporate in a highly discreet manner the device according to the invention containing in its memory the useful medical information into an attractive piece of jewelry, which can be worn virtually permanently.

FIG. 6 shows a device according to the invention incorporated into a watch 60, which has a metallic bottom 61, on which is installed the support with its integrated circuit and its contact 62.

FIG. 7 shows a device according to the invention incorporated into a plastics material watch. Most of these watches are of the quartz type, whose power is supplied by an incorporated battery. A considerable proportion of such watches have on their bottom a metallic battery cover 70 making it possible to change the battery without opening the watch. It is therefore possible to use said cover as the metallic part in which is installed the support with its integrated circuit and its contact 71.

Obviously other embodiments of the device according to the invention exist, but their description would not provide additional information further facilitating the understanding thereof.

I claim:

1. An electronic label comprising the combination of an electrically non-conductive support having an inner surface and an outer surface;
   an integrated memory circuit attached to said inner surface of said support, said integrated memory circuit having first and second input/output terminals;
   a metal cover attached to said inner surface of said support and forming, with said support, a housing for said integrated memory circuit;
   means for electrically connecting said first input/output terminal to said metal cover;
   an electrically conductive region on said outer surface of said support; and
   means for electrically connecting said second input/output terminal to said electrically conductive region;
   whereby electrical connection can be made to said first input/output terminal by electrical contact with said cover and electrical connection to said second input/output terminal can be made by contact with said electrically conductive region.

2. A label according to claim 1 wherein said means for electrically connecting said second input/output terminal to said electrically conductive region comprises a conductor passing through said support.

3. A label according to claim 1 wherein said support comprises a printed circuit board.

4. A label according to claim 1 and further comprising a metal body having means defining a recess for receiving said support with said electrically conductive region in electrical contact with said body and with said cover exposed, whereby electrical connection to said second input/output terminal selectively can be made by contact with said body and through said body to said electrically conductive region.

5. A label according to claim 4 wherein said body comprises a blade of a key having a handle end and a tip end, said recess being located near said tip end.

6. A label according to claim 4 wherein said body comprises a coin.

7. A label according to claim 4 wherein said body comprises a battery cover for a watch.

8. A label according to claim 4 wherein said body comprises a watch case.

9. A label according to claim 4 and further comprising a credit card, said body being attached to said credit card.

10. A label according to claim 4 wherein said body comprises an article of jewelry.

11. A label according to claim 4 and further comprising means for fixedly retaining said support in said recess.

12. An electronic label device comprising the combination of
    a credit card; and
    a plurality of electronic labels mounted on said card, each of said labels comprising
       an electrically non-conductive support having an inner surface and an outer surface;
       an integrated memory circuit attached to said inner surface of said support, said integrated memory circuit having first and second input/output terminals;
       a metal cover attached to said inner surface of said support and forming, with said support, a housing for said integrated memory circuit;
       means for electrically connecting said first input/output terminal to said metal cover;
       an electrically conductive region on said outer surface of said support; and
       means for electrically connecting said second input/output terminal to said electrically conductive region;
       whereby electrical connection can be made to said first input/output terminal by electrical contact with said cover and electrical connection to said second input/output terminal can be made by contact with said electrically conductive region.

13. A device according to claim 12 wherein
    said credit card is rectangular and has a first axis of symmetry parallel with a long side of said card and a second axis of symmetry parallel with a short side of said card,
    said plurality of electronic labels is an even number thereof, and
    said labels are mounted on said card symmetrically relative to said axes of symmetry.

* * * * *